(12) United States Patent
Yamanaka

(10) Patent No.: US 10,211,222 B1
(45) Date of Patent: Feb. 19, 2019

(54) MEMORY DEVICE

(71) Applicant: TOSHIBA MEMORY CORPORATION, Tokyo (JP)

(72) Inventor: Takaya Yamanaka, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/909,439

(22) Filed: Mar. 1, 2018

(30) Foreign Application Priority Data

Sep. 8, 2017 (JP) ................................. 2017-173246

(51) Int. Cl.
*H01L 27/11582* (2017.01)
*H01L 27/11568* (2017.01)
(Continued)

(52) U.S. Cl.
CPC .. *H01L 27/11582* (2013.01); *H01L 21/02636* (2013.01); *H01L 21/31116* (2013.01); *H01L 23/528* (2013.01); *H01L 23/5226* (2013.01); *H01L 23/53271* (2013.01); *H01L 27/11568* (2013.01); *H01L 27/11573* (2013.01); *H01L 29/1037* (2013.01); *H01L 29/456* (2013.01); H01L 21/0217 (2013.01); H01L 21/02164 (2013.01); H01L 21/02238 (2013.01); H01L 21/02247 (2013.01); H01L 21/02271 (2013.01); H01L 21/02532 (2013.01); H01L 21/02592 (2013.01); H01L 21/02614 (2013.01); H01L 21/28525 (2013.01); H01L 21/28568 (2013.01); H01L 21/30625 (2013.01); H01L 29/66545 (2013.01)

(58) Field of Classification Search
CPC ..................... H01L 27/11582; H01L 27/11568
See application file for complete search history.

(56) References Cited

U.S. PATENT DOCUMENTS 8,937,348 B2   1/2015 Jeon
9,123,580 B2   9/2015 Lee et al.
(Continued)

FOREIGN PATENT DOCUMENTS

CN   102263109 A   11/2011
CN   103247632 A   8/2013
CN   106611745 A   5/2017

*Primary Examiner* — Marc Armand
(74) *Attorney, Agent, or Firm* — Kim & Stewart LLP

(57) ABSTRACT

A memory device includes a conductive layer, a first electrode over the conductive layer, and a second electrode between the conductive layer and the first electrode. The second electrode is a material different from that of the first electrode. A semiconductor pillar extends through the first and second electrodes, and has an end connected to the conductive layer. A first insulating film is between the semiconductor pillar and the first and second electrodes and between at least a portion of the semiconductor pillar and the conductive layer. A second insulating film is between the conductive layer and the first insulating film. A third insulating film is between the first insulating film and the second electrode, and between the second and third insulating film. The second electrode and conductive layer include a first element and the second and third insulating films comprise an oxide or nitride of the first element.

20 Claims, 16 Drawing Sheets

(51) Int. Cl.
    *H01L 23/532*     (2006.01)
    *H01L 29/45*     (2006.01)
    *H01L 27/11573*     (2017.01)
    *H01L 21/311*     (2006.01)
    *H01L 21/02*     (2006.01)
    *H01L 23/528*     (2006.01)
    *H01L 23/522*     (2006.01)
    *H01L 29/10*     (2006.01)
    *H01L 29/66*     (2006.01)
    *H01L 21/285*     (2006.01)
    *H01L 21/306*     (2006.01)

(56) References Cited

U.S. PATENT DOCUMENTS

| | | |
|---|---|---|
| 9,362,301 B2 | 6/2016 | Lee et al. |
| 9,431,419 B2 | 8/2016 | Fukuzumi et al. |
| 9,601,577 B1 * | 3/2017 | Lee .................. H01L 27/11578 |
| 9,698,150 B2 | 7/2017 | Maegawa et al. |

* cited by examiner

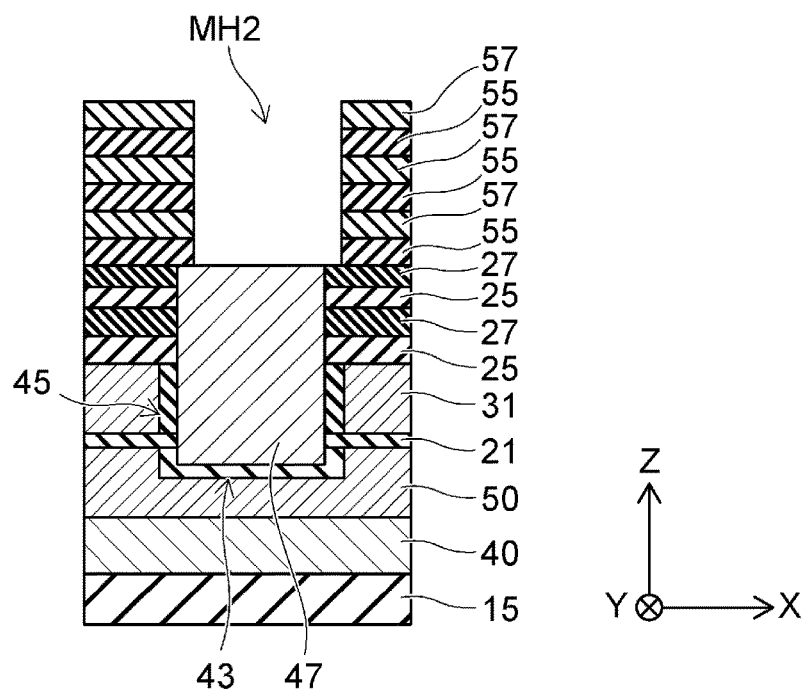
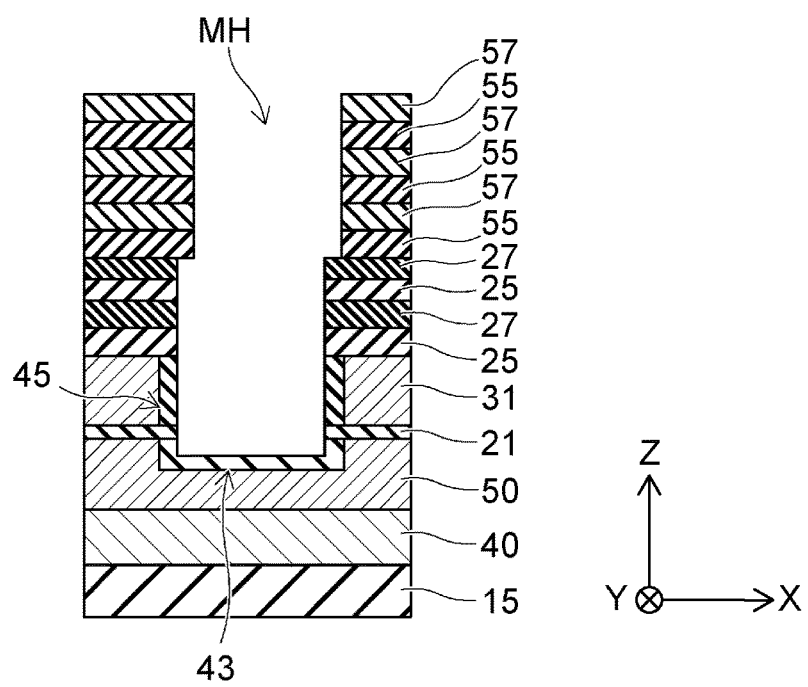

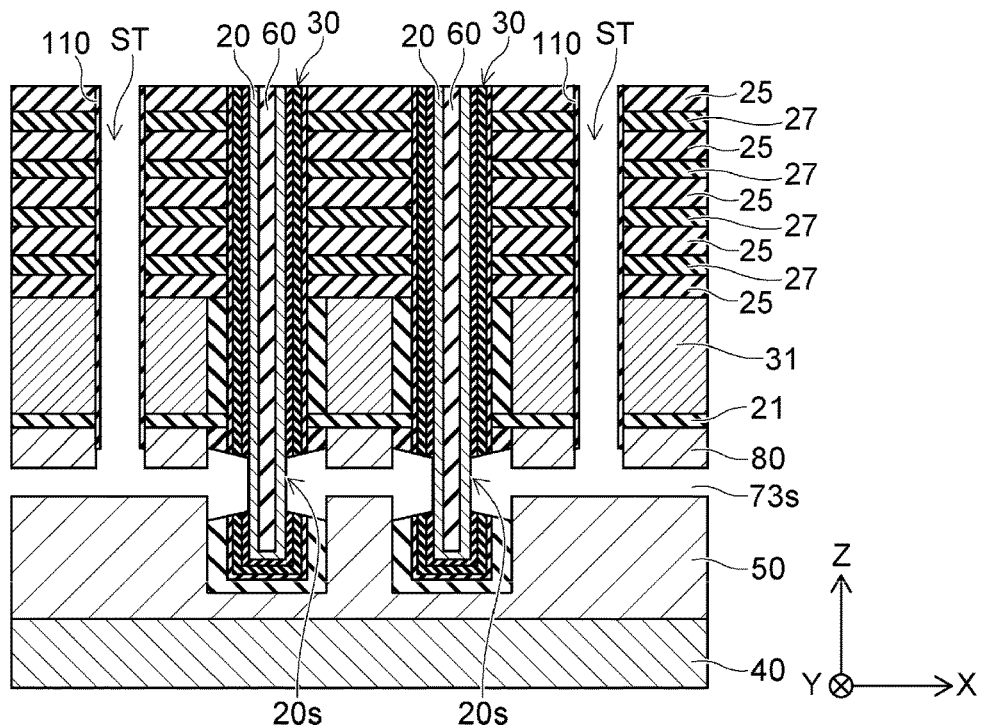
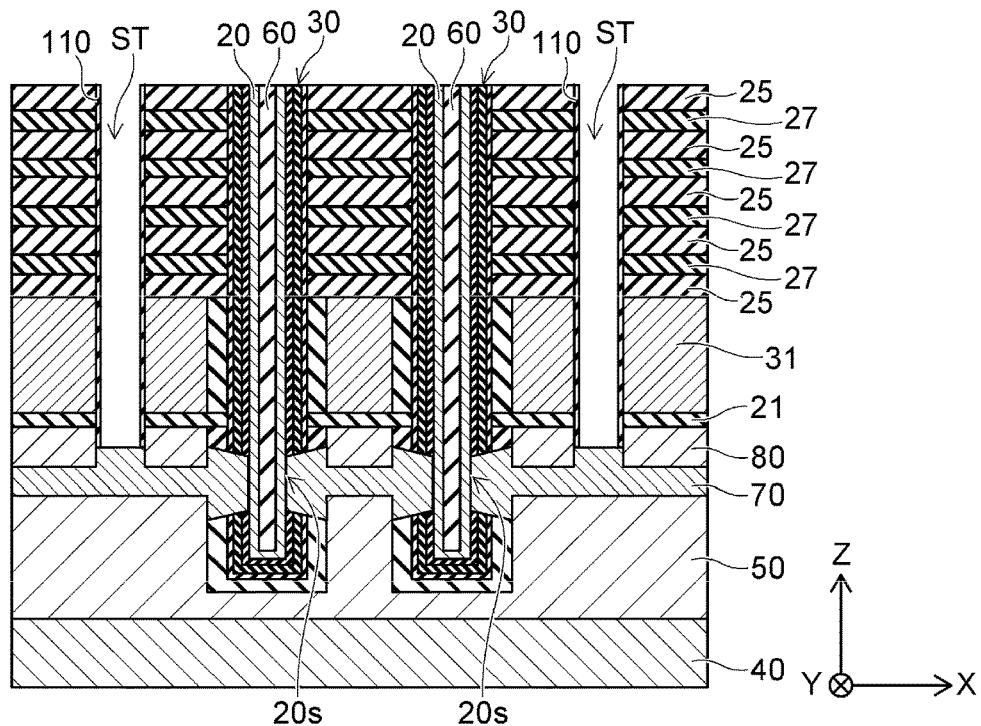

MEMORY DEVICE

CROSS-REFERENCE TO RELATED APPLICATION

This application is based upon and claims the benefit of priority from Japanese Patent Application No. 2017-173246, filed Sep. 8, 2017, the entire contents of which are incorporated herein by reference.

FIELD

Embodiments described herein relate generally to a memory device.

BACKGROUND

Memory devices including three-dimensionally arranged memory cells have been developed. For example, a NAND-type memory device has a structure in which electrode layers are stacked one on the other, and a memory cell is formed in the device where a memory hole penetrates each electrode layer. To increase the storage capacity of such a memory device, it is generally preferable to increase the number of stacked electrode layers. However, as the number of stacked electrode layers increases, it becomes more difficult to form memory holes that penetrate through each electrode layer in the stack.

DESCRIPTION OF THE DRAWINGS

FIGS. 5A and 5B are schematic cross-sectional views depicting aspects of the manufacturing process following FIGS. 4A and 4B.

FIGS. 16A and 16B are schematic cross-sectional views depicting aspects of the manufacturing process following FIGS. 15A and 15B.

DETAILED DESCRIPTION

Figure 1:
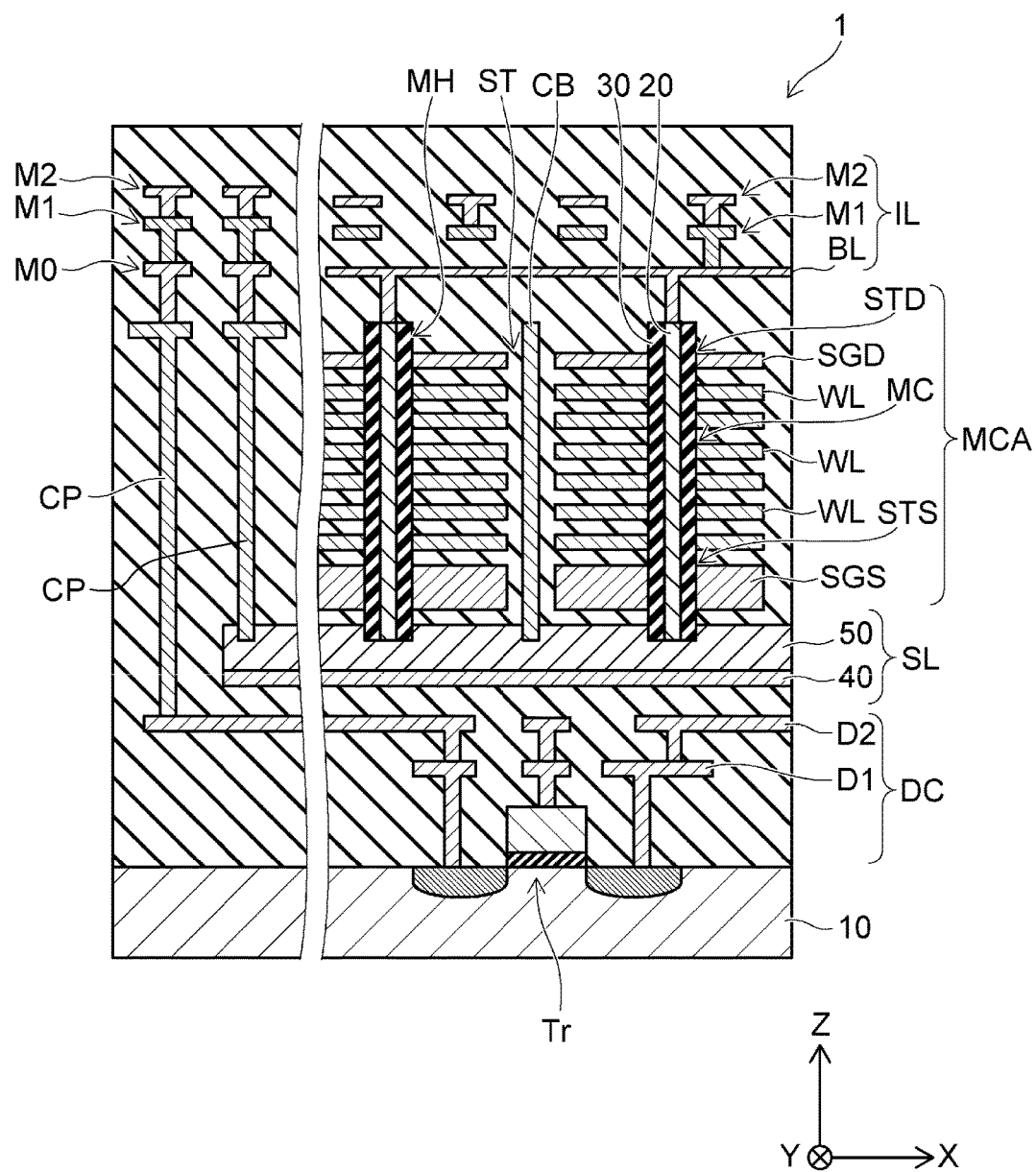
FIG. 1 is a schematic cross-sectional view depicting aspects of a memory device according to a first embodiment.

Embodiments provide a memory device in which a memory hole can be more easily formed so as to improve the manufacturing yield of resulting memory devices.

In general, according to an embodiment, a memory device includes a conductive layer, a first electrode layer located over the conductive layer, a second electrode layer located between the conductive layer and the first electrode layer and comprising a material different from that of the first electrode layer, a semiconductor pillar extending through the first electrode layer and the second electrode layer in a first direction from the conductive layer to the first electrode layer, the semiconductor pillar including an end portion connected to the conductive layer, a first insulating film extending along the semiconductor pillar in the first direction and located between the semiconductor pillar and the first electrode layer, between the semiconductor pillar and the second electrode layer, and between at least a portion of the semiconductor pillar and the conductive layer, a second insulating film located between the conductive layer and the first insulating film, and a third insulating film located between the first insulating film and the second electrode layer. The second insulating film, the third insulating film, the second electrode layer, and the conductive layer include a first element, and the second insulating film and the third insulating film include an oxide or a nitride of the first element.

Hereinafter, embodiments will be described with reference to drawings. Substantially similar portions in the drawings are denoted by the same reference numerals, and a detailed description thereof will be omitted as appropriate, and differences will be described. The drawings are schematic or conceptual, and the relationship between the thickness and the width of each portion, the ratio of the sizes between the portions, and the like are not necessarily the same as those in an actual device. In addition, even in the case of representing the same portions, sometimes the sizes and ratios of the portions are different from each other depending on the drawing.

Furthermore, in the following description, the arrangement and configuration of each portion will be described by using an X axis, a Y axis and a Z axis as shown in each drawing. The X axis, the Y axis, and the Z axis are orthogonal to each other and represent an X direction, a Y direction, and a Z direction, respectively. In addition, in some contexts, a direction along the Z direction may be described as an upward direction, and the opposite direction thereof may be described as a downward direction.

First Embodiment

FIG. 1 is a schematic cross-sectional view showing a memory device 1 according to a first embodiment. The memory device 1 is, for example, a NAND-type nonvolatile memory device including three-dimensionally arranged memory cells MC.

As shown in FIG. 1, the memory device 1 includes a circuit DC and a memory cell array MCA provided on the circuit DC. In addition, the memory device 1 further includes a source line SL and an interconnection layer IL. The source line SL is disposed between the circuit DC and the memory cell array MCA. The interconnection layer IL is provided above the memory cell array MCA.

The circuit DC includes, for example, a transistor Tr provided in a substrate 10, and a D1 wiring and a D2 wiring. The substrate 10 is, for example, a silicon substrate.

The memory cell array MCA includes a plurality of electrode layers stacked over the source line SL. The electrode layer includes a plurality of word lines WL, a selection gate SGS, and a selection gate SGD. The word line WL is disposed between the selection gate SGS and the selection gate SGD.

The memory cell array MCA further includes a semiconductor pillar 20 and an insulating film 30. The semiconductor pillar 20 penetrates a plurality of electrode layers in a stacking direction (Z direction). The semiconductor pillar 20 is connected to the source line SL at the lower end thereof. The insulating film 30 extends along the semiconductor pillar 20 in the Z direction and includes a portion located between the semiconductor pillar 20 and each electrode layer.

The memory cell MC is provided in the portions where the semiconductor pillar 20 intersects the word lines WL. The portion of the insulating film 30 located between the semiconductor pillar 20 and the word line WL functions as a charge holding portion of the memory cell MC. At the portion where the semiconductor pillar 20 intersects the selection gate SGS, a source-side select transistor STS is provided. In addition, at the portion where the semiconductor pillar 20 intersects the selection gate SGD, a drain-side select transistor STD is provided.

The source line SL is provided in a plate shape extending in the X direction and the Y direction and includes a metal layer 40 and a semiconductor layer 50. The semiconductor layer 50 is provided on the metal layer 40, and the lower end of the semiconductor pillar 20 is connected to the semiconductor layer 50.

The interconnection layer IL includes different wiring levels, for example, an M0 wiring, an M1 wiring, and an M2 wiring. In addition, the interconnection layer IL includes a bit line BL electrically connected to the semiconductor pillar 20. The word line WL, and the selection gates SGS and SGD are respectively connected to M0 wirings in a region of the device not specifically depicted.

On the other hand, the D2 wiring of the circuit DC is connected to the M0 wiring, for example, via a contact plug CP provided around the memory cell array MCA. In addition, the source line SL is also connected to the M0 wiring via another contact plug CP.

The memory device 1 includes a slit ST provided between adjacent word lines WL in the X direction, and between the selection gate SGS and the selection gate SGD. Inside the slit ST, a connection conductor CB is provided. The connection conductor CB is, for example, a plate-shaped conductor extending in the Y direction and the Z direction, and is connected to the source line SL. In addition, the connection conductor CB is connected to, for example, the M0 wiring in a region not specifically depicted.

In the interconnection layer IL, the M0 wirings are connected to each other via the M1 wiring and the M2 wiring. As a result, each element of the memory cell array MCA is electrically connected to the circuit DC, and the memory device 1 may be operated.

Figure 2:
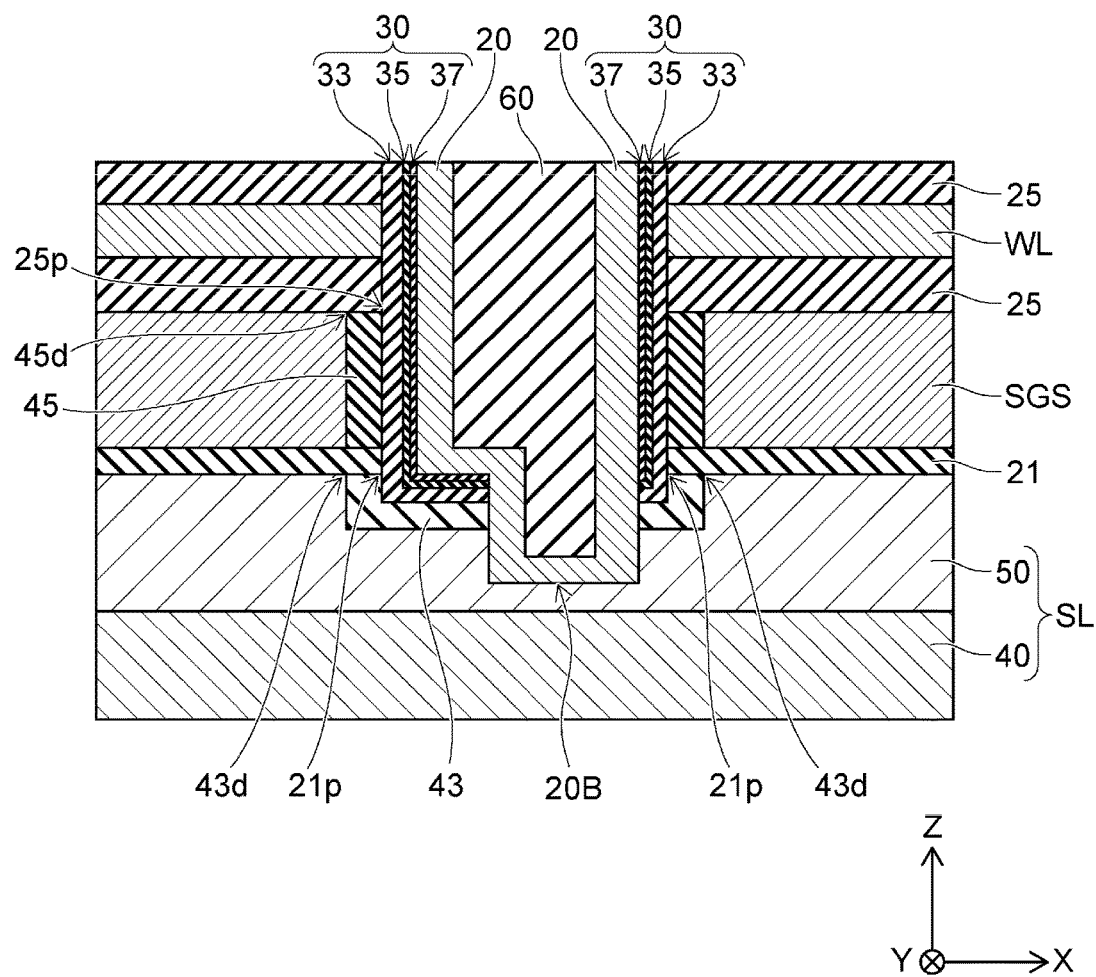
FIG. 2 is a schematic cross-sectional view depicting aspects of a part of the memory device according to the first embodiment.

FIG. 2 is a schematic cross-sectional view showing a part of the memory device 1 according to the first embodiment. FIG. 2 is a cross-sectional view showing a connection region between the source line SL and the lower end of the semiconductor pillar 20. The semiconductor pillar 20 is connected to the semiconductor layer 50 at a lower end 20B thereof. As shown in FIG. 2, the lower end 20B is disposed in the semiconductor layer 50.

An interlayer insulating film 21 is provided between the semiconductor layer 50 and the selection gate SGS. In addition, an interlayer insulating film 25 is provided between the selection gate SGS and the word line WL. The semiconductor pillar 20 surrounds an insulating core 60. The insulating core 60 extends in the Z direction through the interlayer insulating film 21, the selection gate SGS, the interlayer insulating film 25, and the word line WL.

As shown in FIG. 2, the insulating film 30 has a structure in which, for example, a first film 33, a second film 35, and a third film 37 are stacked in a direction from the word line WL to the semiconductor pillar 20. The first film 33 and the third film 37 are, for example, silicon oxide films, and the second film 35 is, for example, a silicon nitride film. The insulating film 30 has a function of trapping charges between the first film 33 and the third film 37. Here, the first film 33 functions as a block insulating film and the third film 37 functions as a tunnel insulating film, for example.

The insulating film 30 includes a portion located between a portion of the semiconductor pillar 20 and the semiconductor layer 50. In this example, an insulating film 43 is provided between the insulating film 30 and the semiconductor layer 50. In addition, an insulating film 45 is provided between the insulating film 30 and the selection gate SGS. The insulating film 43 is formed by oxidizing or nitriding the semiconductor layer 50. Insulating film 45 is formed by oxidizing or nitriding the selection gate SGS. For example, the semiconductor layer 50 and the selection gate SGS are semiconductors comprising silicon (Si), and the insulating films 43 and 45 comprise, for example, silicon oxide or silicon nitride.

The interlayer insulating film 21 is in contact with the upper end of the insulating film 43 and for example, includes an end surface 21p which is located inwardly of an outer edge 43d of the insulating film 43 in the X direction and is in contact with the insulating film 30. In addition, the interlayer insulating film 25 is in contact with the upper end of the insulating film 45 and for example, includes an end surface 25p which is located inwardly of an outer edge 45d of the insulating film 45 in the X direction and is in contact with the insulating film 30.

Next, a method of manufacturing the memory device 1 according to the first embodiment will be described with reference to FIGS. 3A to 7B. FIG. 3A to FIG. 7B are schematic cross-sectional views showing a manufacturing process of the memory device 1.

Figure 3A:
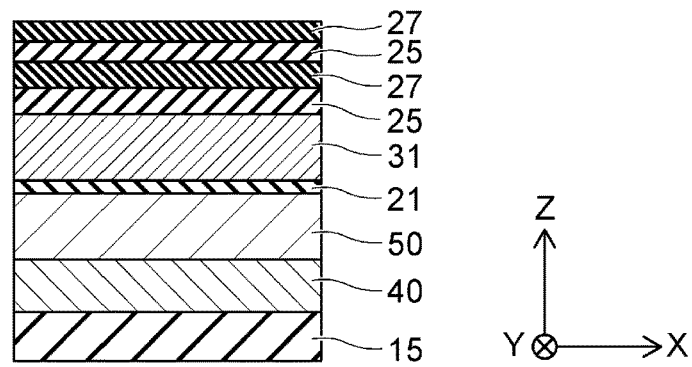
FIGS. 3A to 3C are schematic cross-sectional views depicting aspects of a manufacturing process of the memory device according to the first embodiment.

As shown in FIG. 3A, the metal layer 40 and the semiconductor layer 50 are stacked on the interlayer insulating film 15. The interlayer insulating film 15 is an insulating film covering the circuit DC and is, for example, a silicon oxide film formed using TEOS-Chemical Vapor Deposition (CVD). The metal layer 40 is, for example, a tungsten layer formed using CVD. The semiconductor layer 50 is, for example, a polysilicon layer formed using CVD.

Furthermore, the interlayer insulating films 21 and 25, a sacrificial film 27, and a semiconductor layer 31 are formed on the semiconductor layer 50. The interlayer insulating film 21 is, for example, a silicon oxide film, and is formed on the semiconductor layer 50 using CVD. The semiconductor layer 31 is, for example, a polysilicon layer, and is formed on the interlayer insulating film 21 using CVD.

Subsequently, the interlayer insulating film 25 and the sacrificial film 27 are alternately formed on the semiconductor layer 31. The interlayer insulating film 25 is, for example, a silicon oxide film formed using CVD. The sacrificial film 27 is, for example, a silicon nitride film formed using CVD. The number of interlayer insulating films 25 and sacrificial films 27 shown in FIG. 3A and the following drawings are less than the actual number of layers in an actual device, and a smaller number thereof are shown for the sake of explanatory convenience.

Figure 3B:
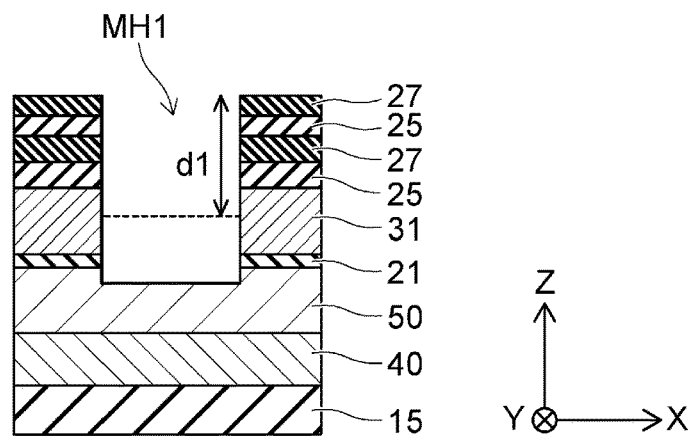

As shown in FIG. 3B, a memory hole MH1 having a depth extending from the top surface of the uppermost sacrificial film 27 to the semiconductor layer 50 is formed. For example, the interlayer insulating film 25 and the sacrificial film 27 are selectively removed to form the memory hole MH1 having a depth dl reaching the semiconductor layer 31. Thereafter, at the bottom of the memory hole MH1, the semiconductor layer 31 and the interlayer insulating film 21 are selectively removed, and the memory hole MH1 is extended until the memory hole MH1 reaches the semiconductor layer 50. In this case, the thickness of the interlayer insulating film 21 in the Z direction is preferably smaller than the thickness of the interlayer insulating film 25 in the Z direction.

The interlayer insulating film 25 and the sacrificial film 27 are selectively removed by using, for example, anisotropic reactive ion etching (RIE). In this process, by using the semiconductor layer 31 as an etching stop film, the controllability of the location of the bottom position of the memory hole MH1 may be improved. For example, the semiconductor layer 31 and the interlayer insulating film 21 are etched in order, but the etching rate thereof may be made lower than the etching rate of the interlayer insulating film 25 and the sacrificial film 27 by using an appropriate etching gas. As a result, for example, the semiconductor layer 50 is removed, and it is possible to avoid exposing the metal layer 40 to the bottom of the memory hole MH1.

Figure 3C:
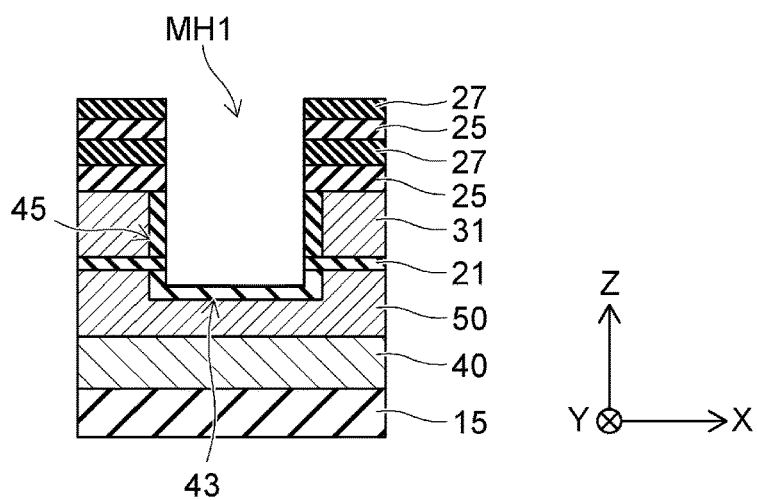

As shown in FIG. 3C, at the bottom of the memory hole MH1, the insulating films 43 and 45 are formed by thermally oxidizing the portions of the semiconductor layers 31 and 50 exposed to the memory hole MH1. The insulating films 43 and 45 are, for example, silicon oxide layers. The insulating film 43 is formed at the bottom of the memory hole MH1, and the insulating film 45 is formed on the side surface of the semiconductor layer 31. The process of forming the insulating films 43 and 45 is not limited to thermal oxidation and they may be formed by oxidation by oxygen radicals or nitriding by nitrogen radicals, for example. That is, the insulating films 43 and 45 may be silicon nitride films.

Figure 4A:
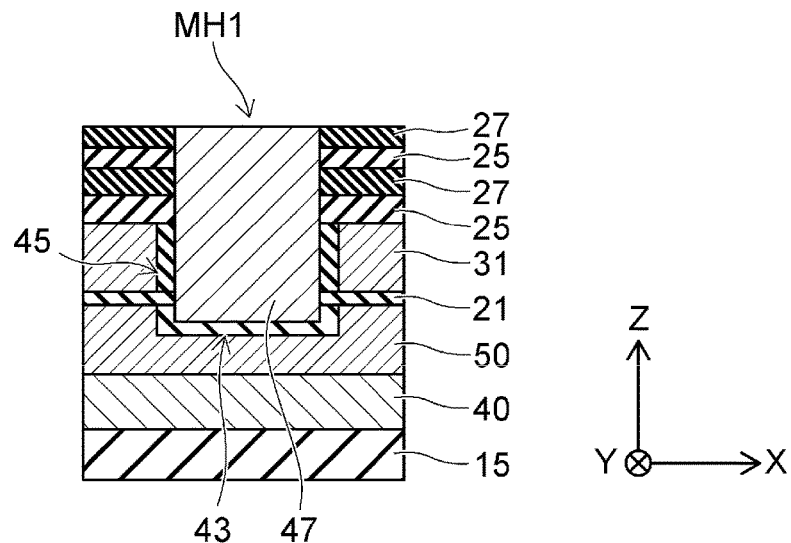
FIGS. 4A and 4B are schematic cross-sectional views depicting aspects of the manufacturing process following FIGS. 3A to 3C.

As shown in FIG. 4A, a sacrificial layer 47 is embedded in the memory hole MH1. The sacrificial layer 47 is, for example, an amorphous silicon layer. For example, an amorphous silicon layer is formed using CVD to fill the inside of the memory hole MH1 and cover the upper surface of the sacrificial film 27. Thereafter, the amorphous silicon layer is removed excepting for the portion thereof in the memory hole MH1. The amorphous silicon layer is removed from the upper surface of the sacrificial layer using, for example, chemical mechanical polishing (CMP).

Figure 4B:
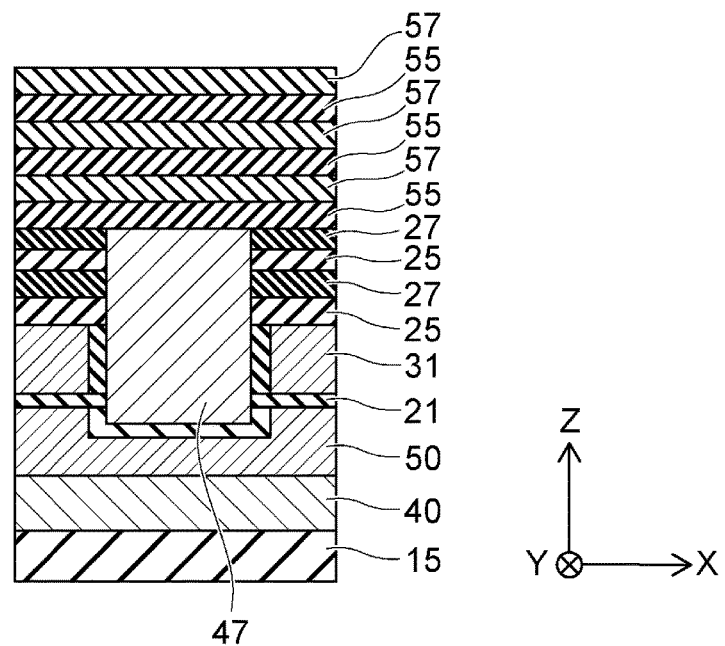

As shown in FIG. 4B, a plurality of interlayer insulating films 55 and a sacrificial films 57 are alternately formed on the surface of the sacrificial film 27 and exposed surface of the sacrificial layer 47. The interlayer insulating film 55 is, for example, a silicon oxide film, and the sacrificial film 57 is, for example, a silicon nitride film. The interlayer insulating films 55 and the sacrificial films 57 are alternately formed.

As shown in FIG. 5A, portions of the interlayer insulating film 55 and the sacrificial film 57 are selectively removed to form a memory hole MH2. The interlayer insulating film 55 and the sacrificial film 57 are removed using, for example, anisotropic RIE. In addition, the memory hole MH2 is formed so as to contact the sacrificial layer 47 into which the memory hole MH1 extends.

As shown in FIG. 5B, by selectively removing the sacrificial layer 47, a memory hole MH including both the memory hole MH1 and the memory hole MH2 is formed. The sacrificial layer 47 is selectively removed using, for example, wet etching. At this time, the insulating film 43 provided at the bottom of the memory hole MH1 prevents the semiconductor layer 50 from being etched by the etching solution of the sacrificial layer 47. In addition, the insulating film 45 prevents the semiconductor layer 31 from being etched by the etching solution of the sacrificial layer 47. As described above, by using the two-step forming method of connecting the memory hole MH1 and the memory hole MH2, it is possible to more easily form a memory hole MH having a high aspect ratio.

Figure 6A:
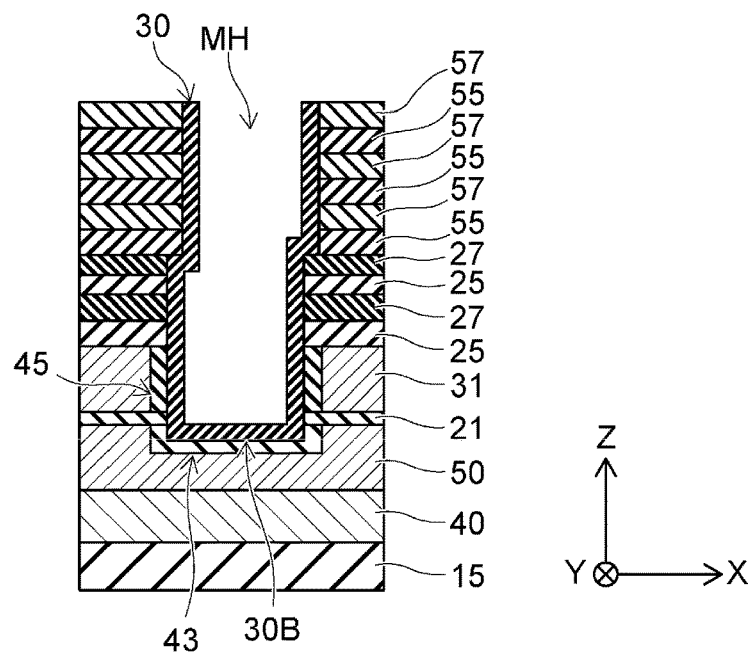
FIGS. 6A and 6B are schematic cross-sectional views depicting aspects of the manufacturing process following FIGS. 5A and 5B.

The insulating film 30 covering the inner surface of the memory hole MH is formed as shown in FIG. 6A. The insulating film 30 is formed using atomic layer deposition (ALD), for example.

Figure 6B:
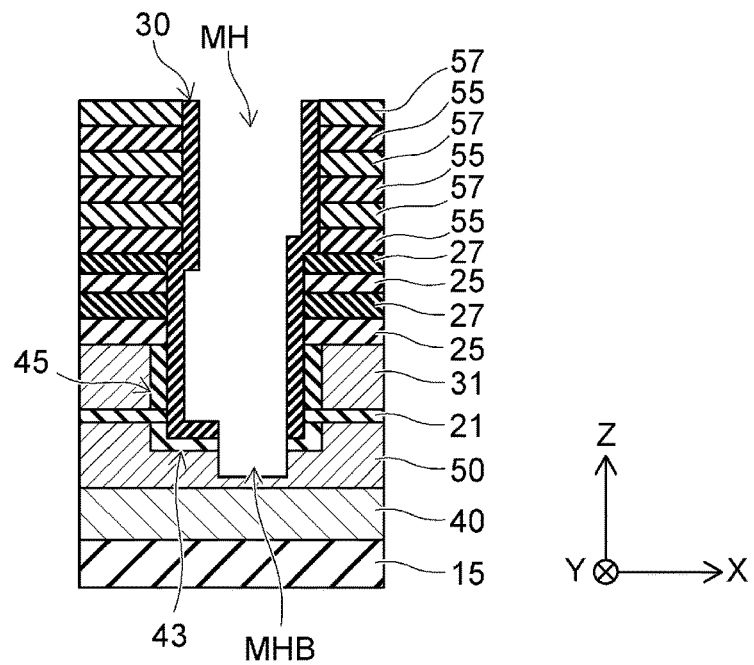

As shown in FIG. 6B, the insulating film 30 and the insulating film 43 are selectively removed from the bottom of the memory hole MH. The insulating film 30 and the insulating film 43 are removed by using, for example, anisotropic RIE. At this time, due to misalignment of the memory hole MH2 with respect to the memory hole MH1 in this example, a portion of each of the insulating film 30 and the insulating film 43 remains on the bottom of the memory hole MH. In general, the misalignment is unintentional.

A portion of the semiconductor layer 50 is also etched in the etching process of the insulating film 30 and the insulating film 43. Therefore, a bottom MHB of the memory hole MH after etching the insulating film 30 and the insulating film 43 is disposed at a level lower than the bottom of the insulating film 43. At this time, the bottom MHB of the memory hole MH is formed so as to extend into the semiconductor layer 50 without reaching the metal layer 40.

Figure 7A:
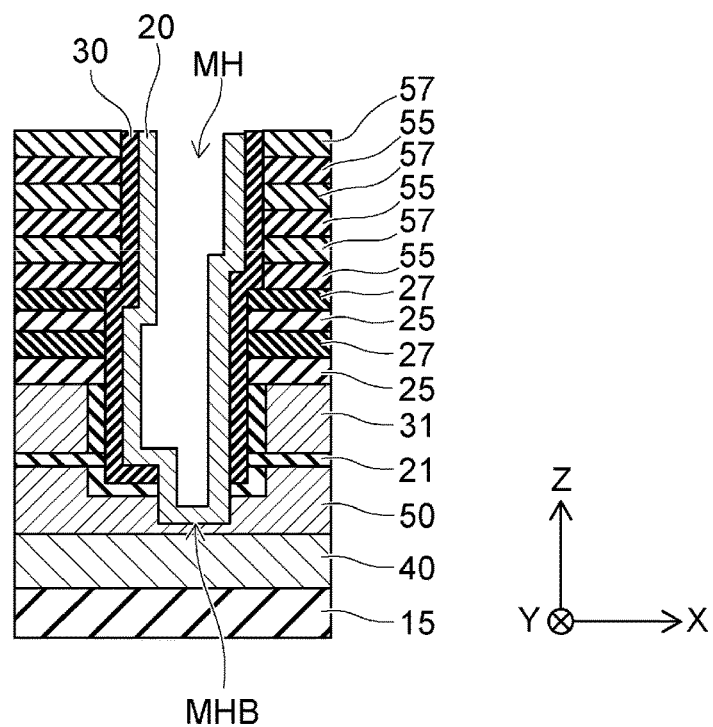
FIGS. 7A and 7B are schematic cross-sectional views depicting aspects of the manufacturing process following FIGS. 6A and 6B.

As shown in FIG. 7A, the semiconductor pillar 20 covering the inner surface of the memory hole MH is next formed. The semiconductor pillar 20 is, for example, a polysilicon layer formed by using CVD. The semiconductor pillar 20 extends into, and is in contact with, the semiconductor layer 50 at the bottom MHB of the memory hole MH. As a result, the contact resistance between the semiconductor pillar 20 and the source line SL may be reduced.

Figure 7B:
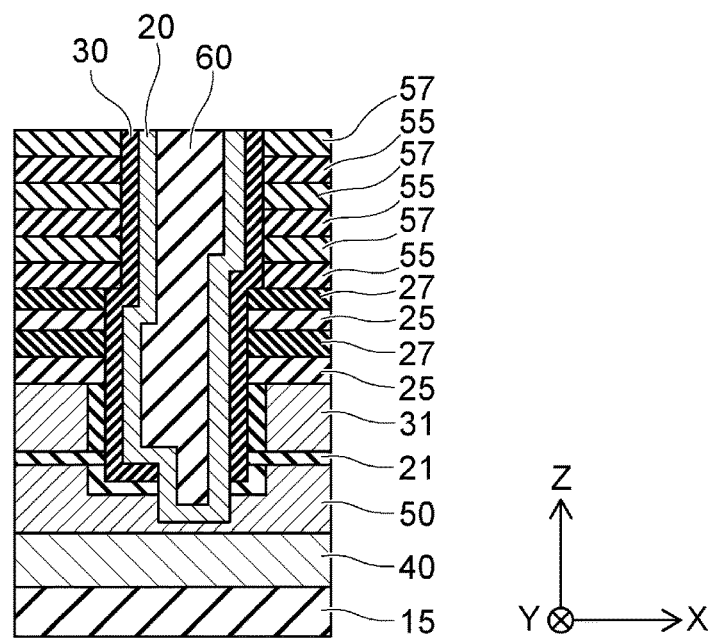

As shown in FIG. 7B, the insulating core 60 is formed inside of the semiconductor pillar 20 in the memory hole MH. The insulating core 60 is, for example, silicon oxide and is formed using CVD. Subsequently, by replacing the sacrificial films 27 and 57 with a metal film, for example, a tungsten film, the word line WL and the selection gate SGD are formed to complete the memory cell array MCA.

Figure 8A:
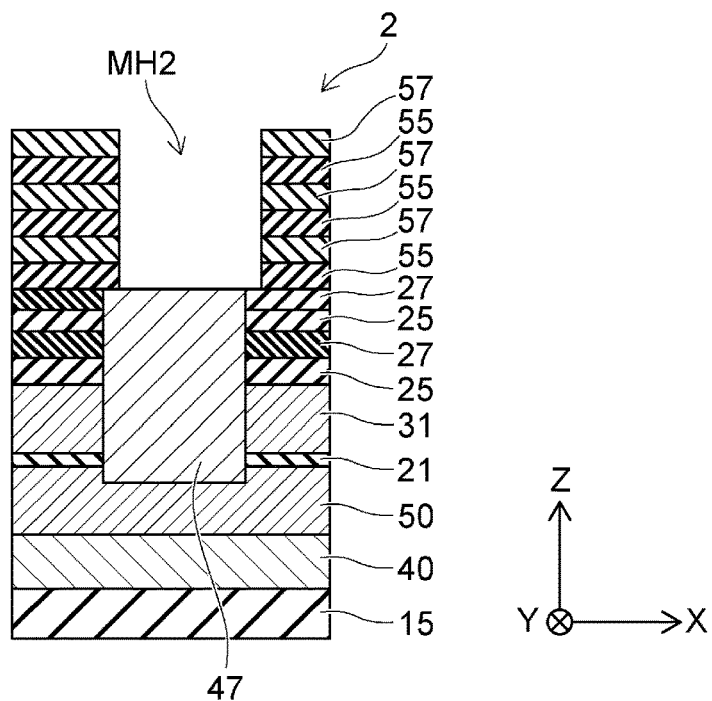
FIGS. 8A and 8B are schematic cross-sectional views depicting aspects of the manufacturing process of a memory device according to a comparative example.
Figure 8B:
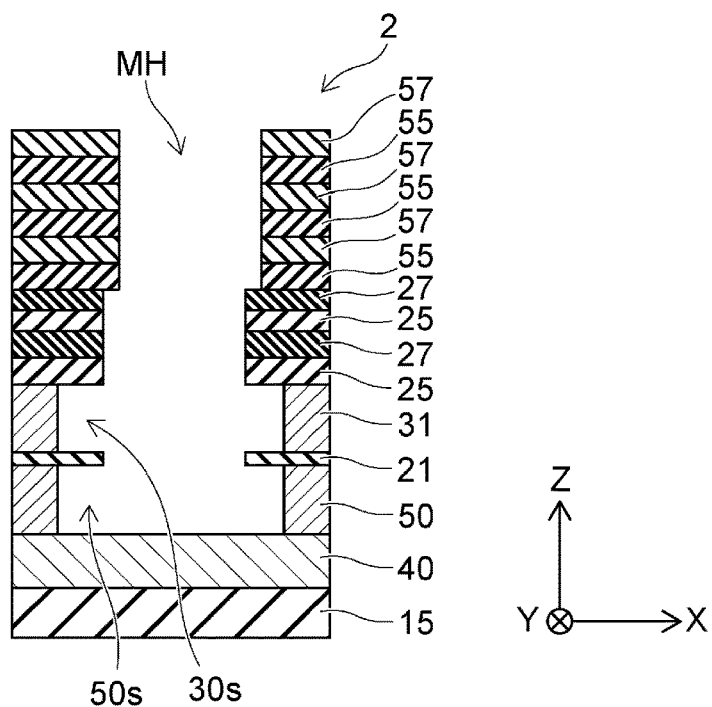

FIGS. 8A and 8B are schematic cross-sectional views showing a manufacturing process of the memory device 2 according to a comparative example. FIG. 8A is a cross-sectional view showing the memory hole MH2 communicating with the sacrificial layer 47. FIG. 8B is a cross-sectional view showing the memory hole MH formed of the memory hole MH1 and the memory hole MH2 by removal of sacrificial layer 47.

As shown in FIG. 8A, in this example, the insulating film 43 is not provided between the sacrificial layer 47 and the semiconductor layer 50, and the insulating film 45 is not provided between the semiconductor layer 31 and the sacrificial layer 47. Therefore, it is not possible to avoid the semiconductor layer 31 and the semiconductor layer 50 being etched in the etching removal process of the sacrificial layer 47.

As a result, as shown in FIG. 8B, after removing the sacrificial layer 47, the spaces 30s and 50s, where the semiconductor layer 31 and the semiconductor layer 50 are etched, are formed. As a result, for example, the metal layer 40 is exposed at the bottom of the memory hole MH, and the semiconductor pillar 20 contacts the metal layer 40. As a result, the contact resistance between the semiconductor pillar 20 and the source line SL may increase. Furthermore, as the etching of the semiconductor layer 31 and the semiconductor layer 50 in the X direction and the Y direction progresses, adjacent memory holes MH may become connected to each other, therefore, possibly destroying the intended stacked structure as shown in FIG. 8B.

In contrast, in the memory device 1 according to the present embodiment, by providing the insulating films 43 and 45 as described, it is possible to prevent etching of the semiconductor layer 31 and semiconductor layer 50, thereby avoiding such detrimental result. As a result, the manufacturing yield of the memory device 1 may be improved.

Figure 9:
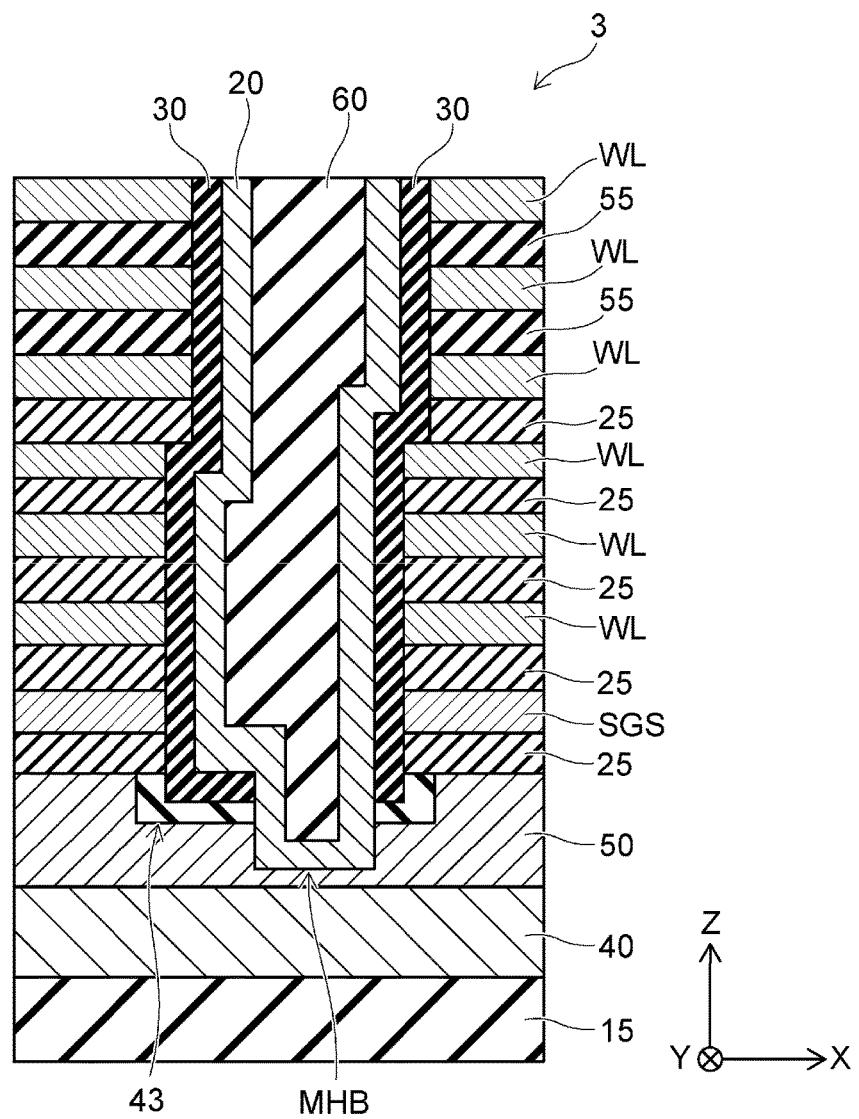
FIG. 9 is a schematic cross-sectional view depicting aspects of a memory device according to a modification example of the first embodiment.

FIG. 9 is a schematic cross-sectional view showing a memory device 3 according to a modification example of the first embodiment. A memory device 3 is formed through the same process as the manufacturing process described conjunction with FIGS. 3A to 7B.

As shown in FIG. 9, the memory device 3 includes the insulating film 43 between the semiconductor layer 50 and the insulating film 30, but has a structure in which the insulating film 45 is not provided between the selection gate SGS and the insulating film 30. Such a structure may be formed, for example, by omitting the semiconductor layer 31 in the stacked structure shown in FIG. 3A. In this example, the selection gate SGS is the same material as the word line WL and the selection gate SGD. In addition, the insulating film 43 prevents etching of the semiconductor layer 50 with the etching solution of the sacrificial layer 47 in locations where it overlies the semiconductor layer 50.

Second Embodiment

Figure 10:
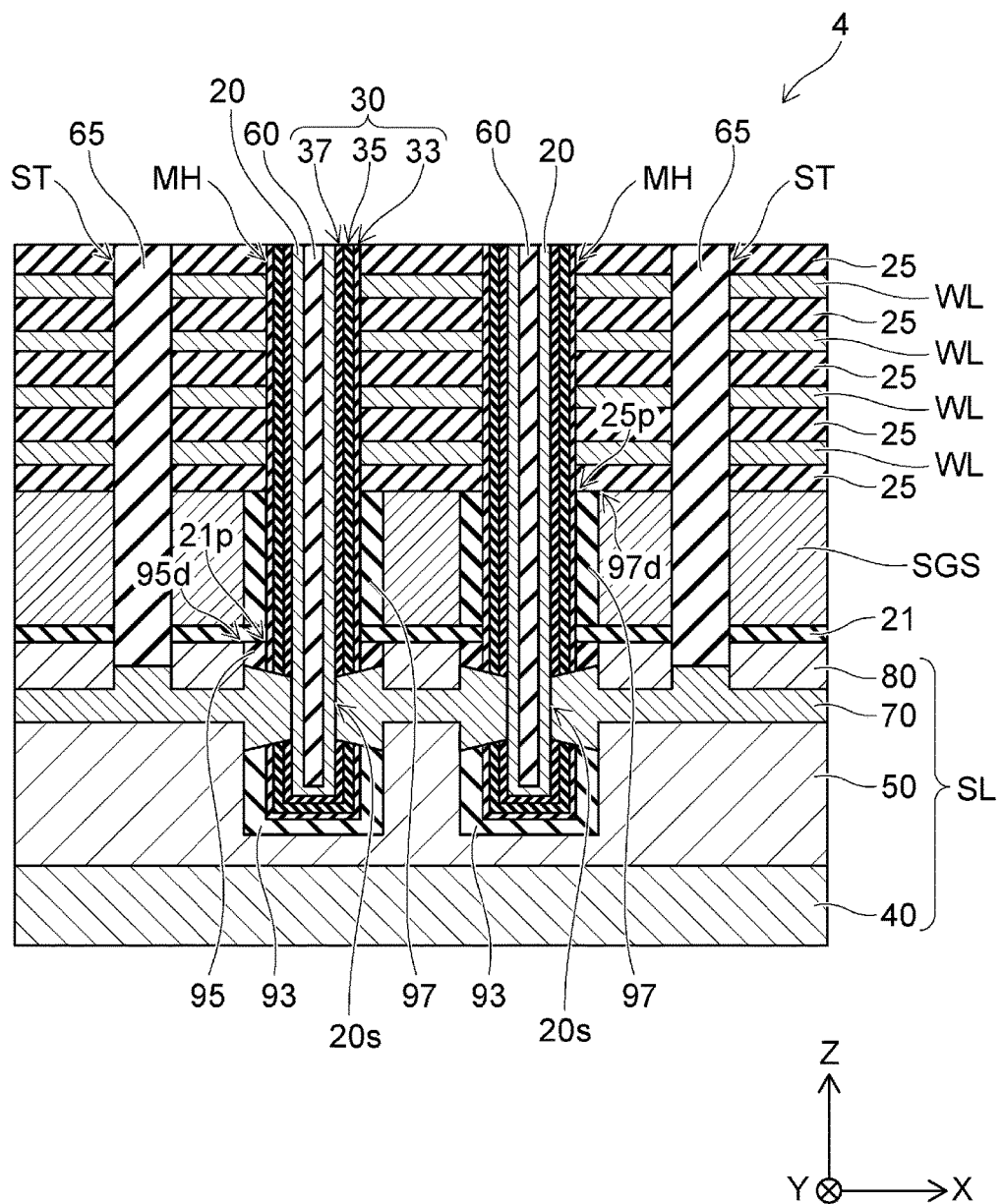
FIG. 10 is a schematic cross-sectional view depicting aspects of a memory device according to a second embodiment.

FIG. 10 is a schematic cross-sectional view showing a memory device 4 according to a second embodiment. The source line SL of the memory device 4 includes a metal layer 40, and semiconductor layers 50, 70, and 80. The semiconductor layer 70 is in contact with the lowermost side surface 20s of the semiconductor pillars 20, and the source line SL is electrically connected to the semiconductor pillar 20 through the semiconductor layer 70.

As shown in FIG. 10, the semiconductor layer 50 is provided on the metal layer 40, and the semiconductor layer 70 is provided on the semiconductor layer 50. The semiconductor layer 80 is provided on the semiconductor layer 70. The semiconductor layers 50, 70 and 80 are, for example, silicon layers.

The selection gate SGS is provided on the semiconductor layer 80 with the interlayer insulating film 21 therebetween. In addition, a plurality of word lines WL are stacked on the selection gate SGS, with an interlayer insulating film 25 therebetween. Furthermore, the selection gate SGD (not shown) is provided above the word line WL.

The memory hole MH extends to a depth extending inwardly of the semiconductor layer 50 through a plurality of word lines WL, the selection gate SGS, the interlayer insulating films 21 and 25, and the semiconductor layers 70 and 80. Inside the memory hole MH, the semiconductor pillar 20, the insulating film 30, and the insulating core 60 are provided. The insulating film 30 includes a stacked structure including, for example, the first film 33, the second film 35 and the third film 37.

An insulating film 93 is provided between the semiconductor layer 50 and the insulating film 30, and an insulating film 95 is provided between the semiconductor layer 80 and the insulating film 30. Furthermore, an insulating film 97 is provided between the selection gate SGS and the insulating film 30.

The interlayer insulating film 21 is in contact with the upper end of the insulating film 95. In addition, the end surface 21p of the interlayer insulating film 21 is located inwardly of an outer edge 95d of the insulating film 95 in the X direction, for example, and is in contact with the insulating film 30. In addition, the interlayer insulating film 25 is in contact with the upper end of the insulating film 97. Furthermore, the end surface 25p of the interlayer insulating film 25 is located inwardly of an outer edge 97d of the insulating film 97 in the X direction, for example, and is in contact with the insulating film 30.

Next, a method of manufacturing the memory device 4 according to the second embodiment will be described with reference to FIGS. 11A to 16B. FIGS. 11A to 16B are schematic cross-sectional views showing a manufacturing process of the memory device 4.

Figure 11A:
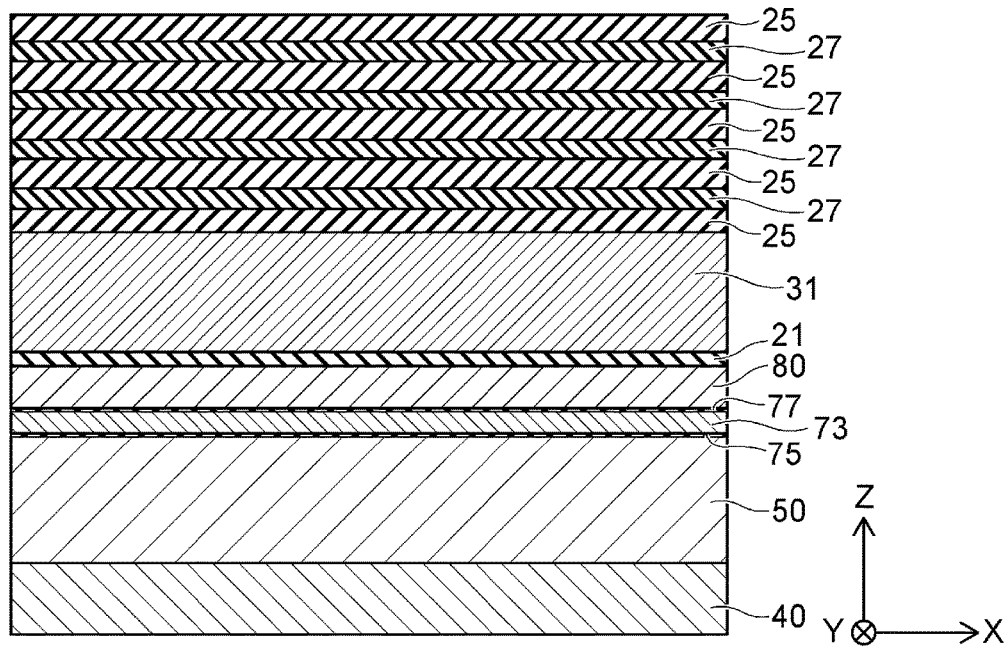
FIGS. 11A and 11B are schematic cross-sectional views depicting aspects of a manufacturing process of the memory device according to the second embodiment.

As shown in FIG. 11A, the semiconductor layers 50, 73 and 80 are formed as a stack on the metal layer 40. An insulating film 75 is formed between the semiconductor layer 50 and the semiconductor layer 73. In addition, an insulating film 77 is formed between the semiconductor layer 73 and the semiconductor layer 80.

The metal layer 40 is provided above the substrate 10 over an intervening interlayer insulating film (see FIG. 1). The semiconductor layers 50, 73 and 80 are, for example, polysilicon layers formed using CVD. The insulating films 75 and 77 are, for example, silicon oxide films.

The semiconductor layer 31 is formed on the semiconductor layer 80 over the intervening interlayer insulating film 21. Furthermore, a plurality of interlayer insulating films 25 and the sacrificial films 27 are alternately formed on the semiconductor layer 31. The semiconductor layer 31 is, for example, a low resistance polysilicon layer, and the interlayer insulating films 21 and 25 are, for example, silicon oxide films. The sacrificial film 27 is, for example, a silicon nitride film.

Figure 11B:
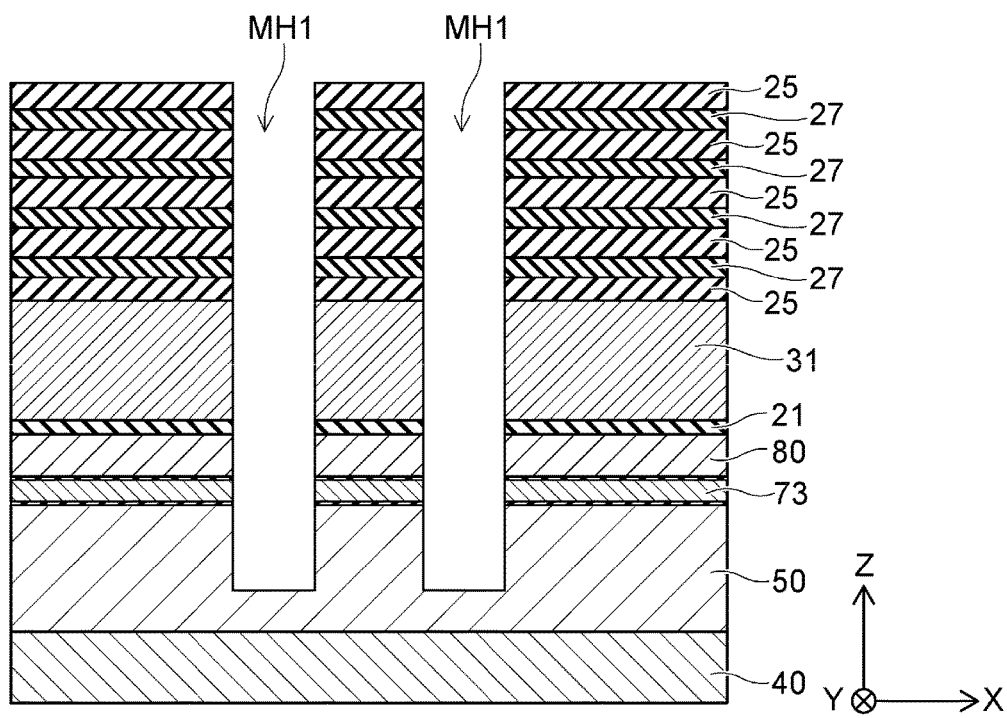

As shown in FIG. 11B, the memory hole MH1 having a depth extending from the uppermost interlayer insulating film 25 and ending inwardly of the semiconductor layer 50 is formed. The memory hole MH1 is formed using, for example, anisotropic RIE. In the process of forming the memory hole MH1, the semiconductor layer 31 functions as an intermediate etching stop layer. Subsequently, the semiconductor layer 31, the interlayer insulating film 21, the semiconductor layer 80, the insulating film 77, the semiconductor layer 73, and the insulating film 75 are selectively etched in order. As a result, it is easier to position the bottom of the memory hole MH1 within the semiconductor layer 50.

Figure 12A:
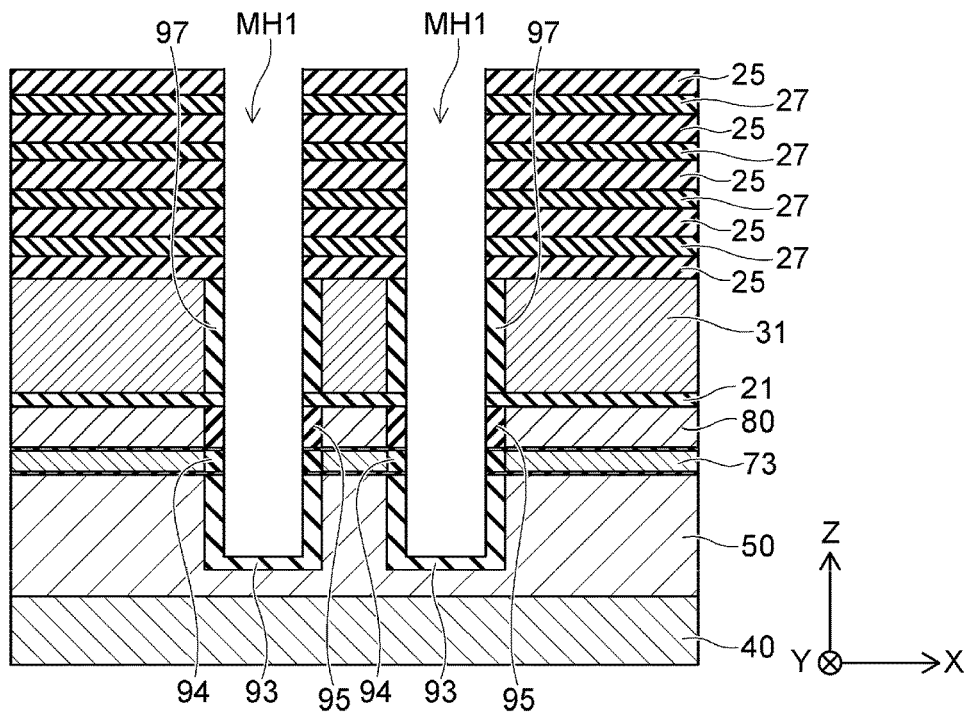
FIGS. 12A and 12B are schematic cross-sectional views depicting aspects of a manufacturing process following FIGS. 11A and 11B.

As shown in FIG. 12A, the insulating films 93, 94, 95 and 97 are formed at the bottom of the memory hole MH1. The insulating films 93, 94, 95 and 97 are formed, for example, by thermal oxidation of the semiconductor layers 50, 73, 80 and the semiconductor layer 31 exposed on the inner surface of the memory hole MH1, respectively. The insulating films 93, 94, 95 and 97 are, for example, silicon oxide films.

Figure 12B:
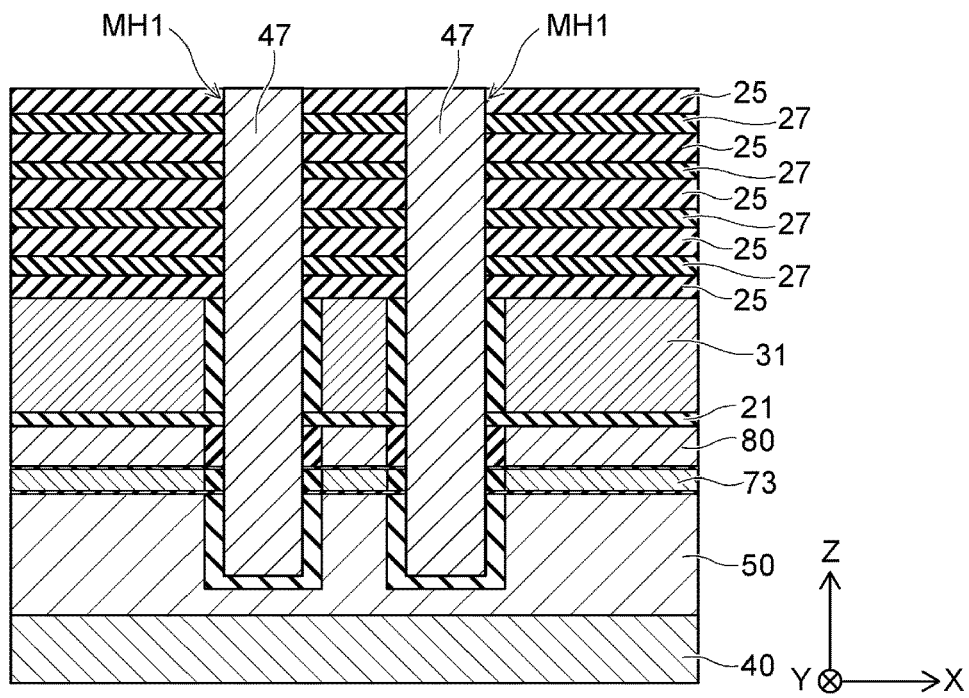

As shown in FIG. 12B, the sacrificial layer 47 is formed inside the memory hole MH1. The sacrificial layer 47 is, for example, an amorphous silicon layer formed using CVD. For example, after depositing an amorphous silicon layer in the memory hole MH1 and covering the uppermost interlayer insulating film 25, a portion thereof formed on the interlayer insulating film 25 is removed using CMP, whereby the sacrificial layer 47 within the memory hole MH1 is left.

Figure 13:
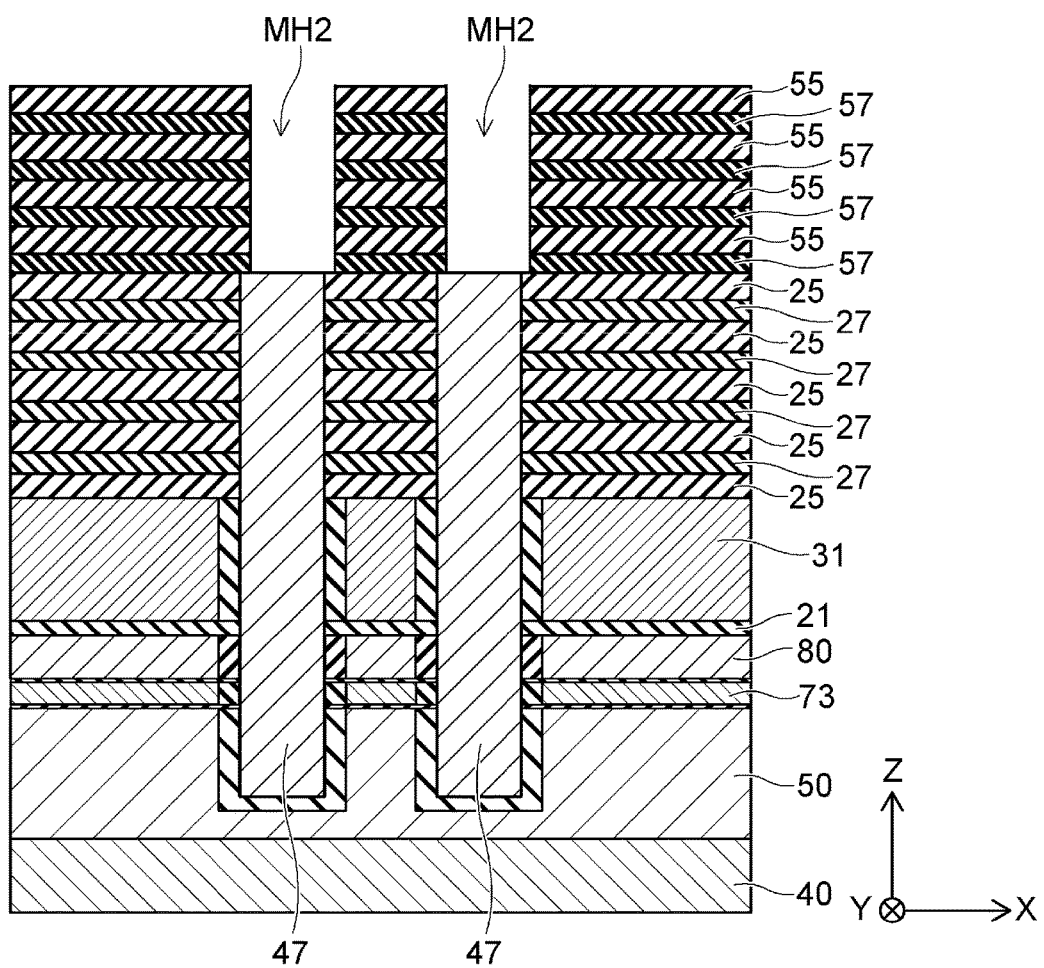
FIG. 13 is a schematic cross-sectional view depicting aspects of the manufacturing process following FIG. 12.

As shown in FIG. 13, interlayer insulating films 55 and sacrificial films 57 are then alternately stacked to form a stacked body in which interlayer insulating films 25 and sacrificial films 27 are alternately stacked. Subsequently, the memory hole MH2 communicating with the sacrificial layer 47 is formed extending from the uppermost layer of the interlayer insulating film 55. The memory hole MH2 is formed, for example, by selectively removing portions of the interlayer insulating films 55 and the sacrificial films 57 using anisotropic RIE.

Figure 14A:
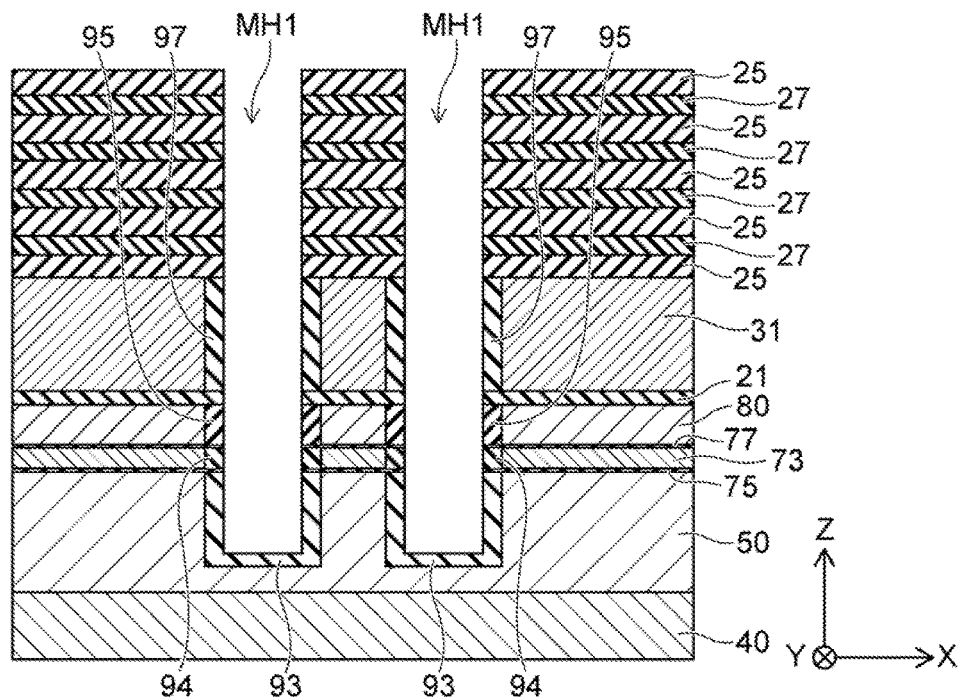
FIGS. 14A and 14B are schematic cross-sectional views depicting aspects of a manufacturing process following FIG. 13.

As shown in FIG. 14A, the remaining sacrificial layer 47 in the memory hole MH1 selectively removed. The insulating films 93, 94, 95, and 97 protect each of the semiconductor layers 50, 73, 80, and 31 from being etched by the etchant of sacrificial layer 47 in the process of removing the sacrificial layer 47. For the sake of convenience, the interlayer insulating film 55 and the sacrificial film 57 are omitted in FIG. 14A and the subsequent figures.

Figure 14B:
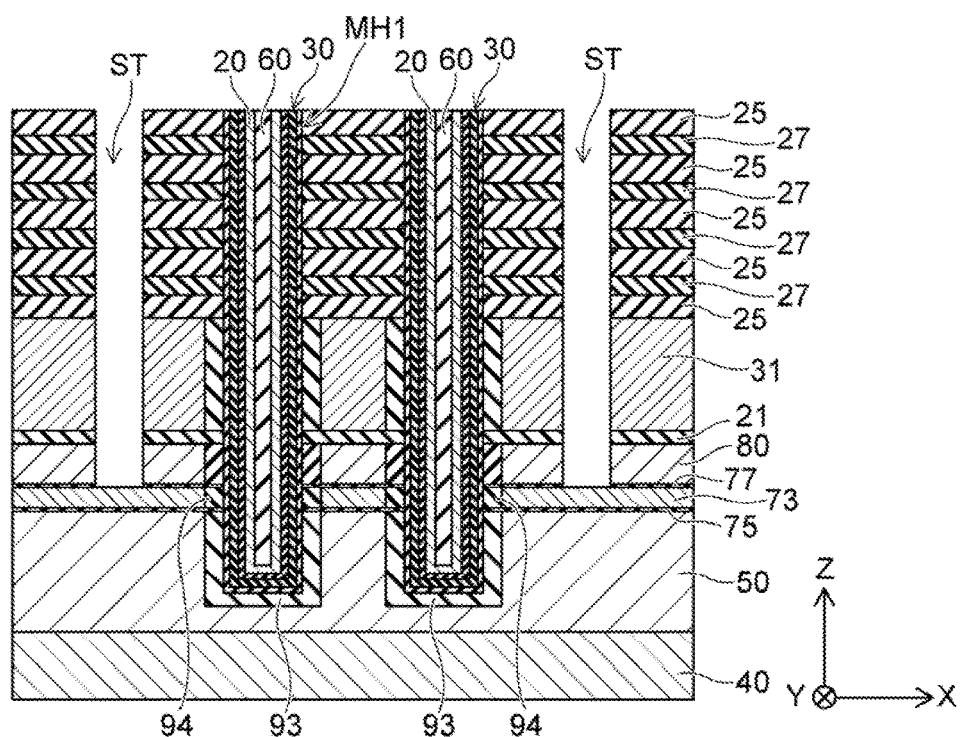

As shown in FIG. 14B, the semiconductor pillar 20, the insulating film 30, and the insulating core 60 are formed inside the memory hole MH1. The semiconductor pillar 20, the insulating film 30, and the insulating core 60 are also formed inside the not-shown memory hole MH2 (see FIG. 7B). In the present embodiment, at the bottom of the memory hole MH1, it is not necessary to selectively remove a part of the insulating film 30 to form the semiconductor pillar 20 (see FIG. 6B), and the insulating film 30, the semiconductor pillar 20, and the insulating core 60 are formed inside the memory holes MH1 and MH2 in order.

Subsequently, the slit ST is formed so as to divide the interlayer insulating films 21, 25, the sacrificial film 27, the semiconductor layers 80 and 31, and the interlayer insulating film 55 and the sacrificial film 57. At this time, the semiconductor layer 31 and the insulating film 77 function as an etching stop layer. For example, the semiconductor layer 31 functions as an etching stop layer when removing the interlayer insulating films 25 and 55 and the sacrificial layers 27 and 57. Furthermore, the insulating film 77 functions as an etching stop layer for making the bottom of the slit ST be at the level of the upper surface of the semiconductor layer 73. That is, the slit ST is formed such that the upper surface of the semiconductor layer 73 is exposed at the bottom thereof.

Figure 15A:
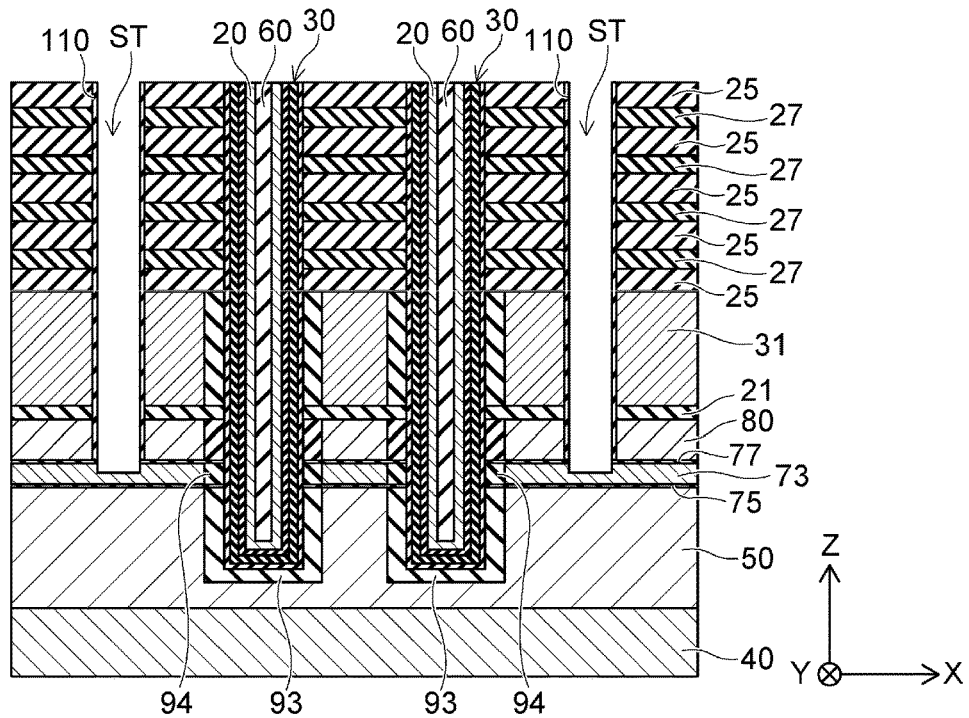
FIGS. 15A and 15B are schematic cross-sectional views depicting aspects of a manufacturing process following FIGS. 14A and 14B.

As shown in FIG. 15A, an insulating film 110 is formed on the inner wall of the slit ST. For example, after forming an insulating film covering the inner surface of the slit ST, the insulating film 110 is formed by removing a portion thereof covering the bottom of the slit ST using anisotropic RIE.

Figure 15B:
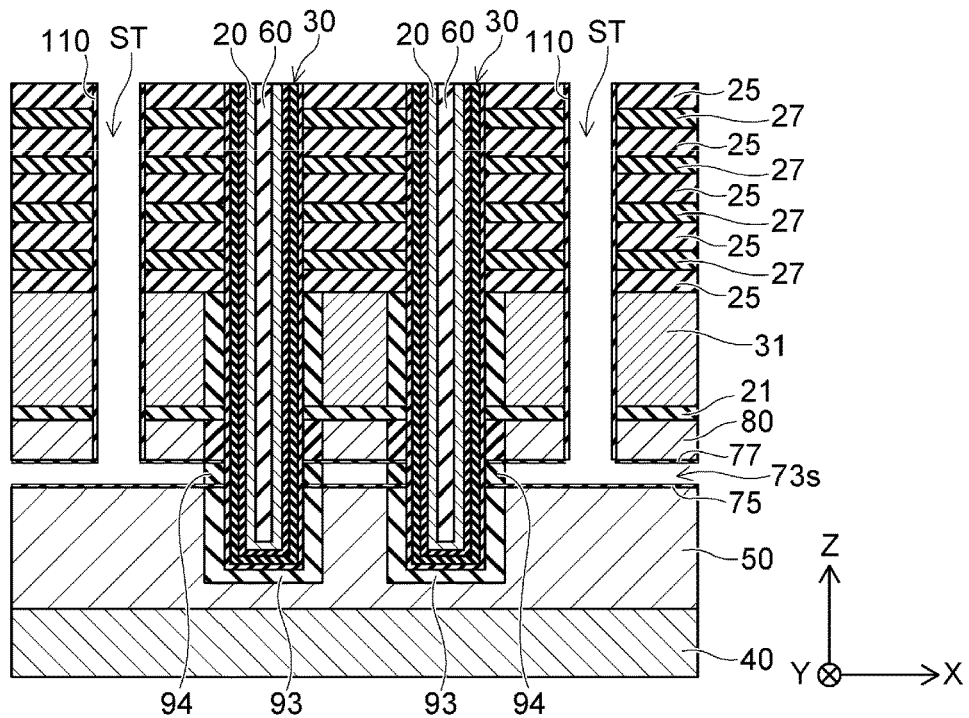

As shown in FIG. 15B, the semiconductor layer 73 is selectively removed via the slit ST. The semiconductor layer 73 is removed, for example, by wet etching. At this time, the insulating films 75, 77, and 110 protect the semiconductor layers 50, 80, and 31 from being etched by the etching solution of the semiconductor layer 73.

As shown in FIG. 16A, in a space 73s formed by removal of the semiconductor layer 73, the insulating films 30, 75, and 77 are removed, and the side surface 20s of the semiconductor pillar 20 is exposed. The insulating films 30, 75, and 77 are removed by, for example, an etching solution supplied via the slit ST. The insulating film 110 is, for example, a silicon nitride film and is formed to have a thickness remaining on the inner wall of the slit ST even after removing the insulating films 30, 75, and 77.

As shown in FIG. 16B, the semiconductor layer 70 is then formed inside the space 73s. For example, a silicon layer is deposited on each of the surfaces of the semiconductor pillar 20, and the semiconductor layers 50 and 80 exposed in the space 73s, and the inside of the space 73s is embedded. As a result, the semiconductor layer 70 is formed. The semiconductor layer is formed so as to be electrically connected to the semiconductor pillar 20, and the semiconductor layers 50 and 80.

Subsequently, after removing the insulating film 110, the sacrificial films 25 and 55 are selectively removed. Thereafter, for example, a metal layer is formed in the space formed where the sacrificial films 25 and 55 were removed. As a result, a plurality of word lines WL are formed. Furthermore, an insulating film 65 is formed in the slit T to complete the memory device 4 (see FIG. 10).

Also in the memory device 4 according to the present embodiment, by providing the insulating films 93, 94, 95, and 97, it is possible to prevent etching of the semiconductor layers 31, 50, 73, and 80 in the removing process of the sacrificial layer 47. As a result, it is possible to prevent defects caused by formation of the semiconductor pillar 20 on the metal layer 40 via the insulating film 30, for example, diffusion of metal atoms into the semiconductor pillar 20. In addition, it is possible to avoid the collapse of the stacked structure as a result of the connection between the adjacent memory holes MH.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
  a conductive layer;
  a first electrode layer over the conductive layer;
  a second electrode layer between the conductive layer and the first electrode layer and comprising a material different from that of the first electrode layer;
  a semiconductor pillar extending through the first electrode layer and the second electrode layer in a first direction from the conductive layer to the first electrode layer, the semiconductor pillar having an end portion connected to the conductive layer;
  a first insulating film extending along the semiconductor pillar in the first direction and located between the semiconductor pillar and the first electrode layer, between the semiconductor pillar and the second electrode layer, and between at least a portion of the semiconductor pillar and the conductive layer;

a second insulating film between the conductive layer and the first insulating film; and a third insulating film between the first insulating film and the second electrode layer, wherein the second insulating film, the third insulating film, the second electrode layer, and the conductive layer each comprise a first element, and the second insulating film and the third insulating film each comprise an oxide or a nitride of the first element.

2. The memory device according to claim 1, further comprising:

a first interlayer insulating film between the conductive layer and the second electrode layer and contacting the first insulating film and the second insulating film, wherein the first interlayer insulating film extends inwardly of an outer edge of the second insulating film and includes a side surface contacting the first insulating film.

3. The memory device according to claim 2, further comprising:

a second interlayer insulating film between the first electrode layer and the second electrode layer and contacting the first insulating film and the third insulating film, wherein the second interlayer insulating film extends inwardly of the outer edge of the third insulating film and includes a side surface contacting the first insulating film.

4. The memory device according to claim 1, wherein the conductive layer and the second electrode layer include polysilicon.

5. The memory device according to claim 1, wherein the semiconductor pillar extends into the conductive layer.

6. The memory device according to claim 5, wherein the semiconductor pillar extends through the second insulating film.

7. The memory device according to claim 1, wherein a first portion of the semiconductor pillar is offset from a second portion of the semiconductor pillar in a second direction orthogonal to the first direction.

8. The memory device according to claim 1, further comprising:

a fourth electrode which is over the first electrode and penetrated by the semiconductor pillar.

9. A memory device, comprising:

a conductive layer;

a plurality of electrode layers stacked on the conductive layer one over the other in a stacking direction;

a semiconductor pillar extending through the plurality of electrode layers in the stacking direction, the semiconductor pillar having an end portion connected to the conductive layer;

a first insulating film between the semiconductor pillar and the plurality of electrode layers and between the semiconductor pillar and the conductive layer, the first insulating film extending along the semiconductor pillar in the stacking direction; and a second insulating film between the conductive layer and the first insulating film, wherein the second insulating film and the conductive layer include a first element and the second insulating film comprises an oxide or a nitride of the first element.

10. The memory device according to claim 9, wherein the plurality of electrode layers include at least one first electrode and at least one second electrode between the first electrode and the conductive layer.

11. The semiconductor device according to claim 10, further comprising:

a third insulating film between the first insulating film and the second electrode layer, wherein the third insulating film and the second electrode layer include the first element, and the third insulating film comprises an oxide or a nitride of the first element.

12. The memory device according to claim 11, further comprising:

a first interlayer insulating film between the conductive layer and the second electrode layer and contacting the first insulating film and the second insulating film, wherein the first interlayer insulating film extends inwardly of an outer edge of the second insulating film and has a side surface contacting the first insulating film.

13. The memory device according to claim 12, further comprising:

a second interlayer insulating film between the first electrode layer and the second electrode layer and contacting the first insulating film and the third insulating film, wherein the second interlayer insulating film extends inwardly of the outer edge of the third insulating film and has a side surface contacting the first insulating film.

14. The memory device according to claim 11, wherein the conductive layer and the second electrode layer each comprise polysilicon.

15. The memory device according to claim 11, wherein the semiconductor pillar extends into the conductive layer.

16. The memory device according to claim 15, wherein the semiconductor pillar extends through the second insulating film.

17. The memory device according to claim 11, wherein a first portion of the semiconductor pillar is offset from a second portion of the semiconductor pillar in a second direction orthogonal to the first direction.

18. A memory device, comprising:

a conductive layer;

a semiconductor layer on the conductive layer;

a plurality of electrode layers stacked one over the other in a stacking direction over the semiconductor layer;

a semiconductor pillar extending through the plurality of electrode layers and the semiconductor layer in the stacking direction, the semiconductor pillar including an end portion extending into of the conductive layer and connected to the semiconductor layer;

a first insulating film between the semiconductor pillar and the plurality of electrode layers and between the semiconductor pillar and the conductive layer, and extending along the semiconductor pillar in the stacking direction; and a second insulating film located between the conductive layer and the first insulating film, wherein the second insulating film and the conductive layer include a first element and the second insulating film comprises an oxide or a nitride of the first element.

19. The memory device according to claim 18, wherein the plurality of electrode layers include at least one first electrode and at least one second electrode located between the first electrode and the conductive layer.

20. The semiconductor device according to claim 19, further comprising:

a third insulating film located between the first insulating film and the second electrode, wherein the third insulating film and the second electrode layer include the first element, and the third insulating film comprises an oxide or a nitride of the first element.

* * * * *